Figure 1:
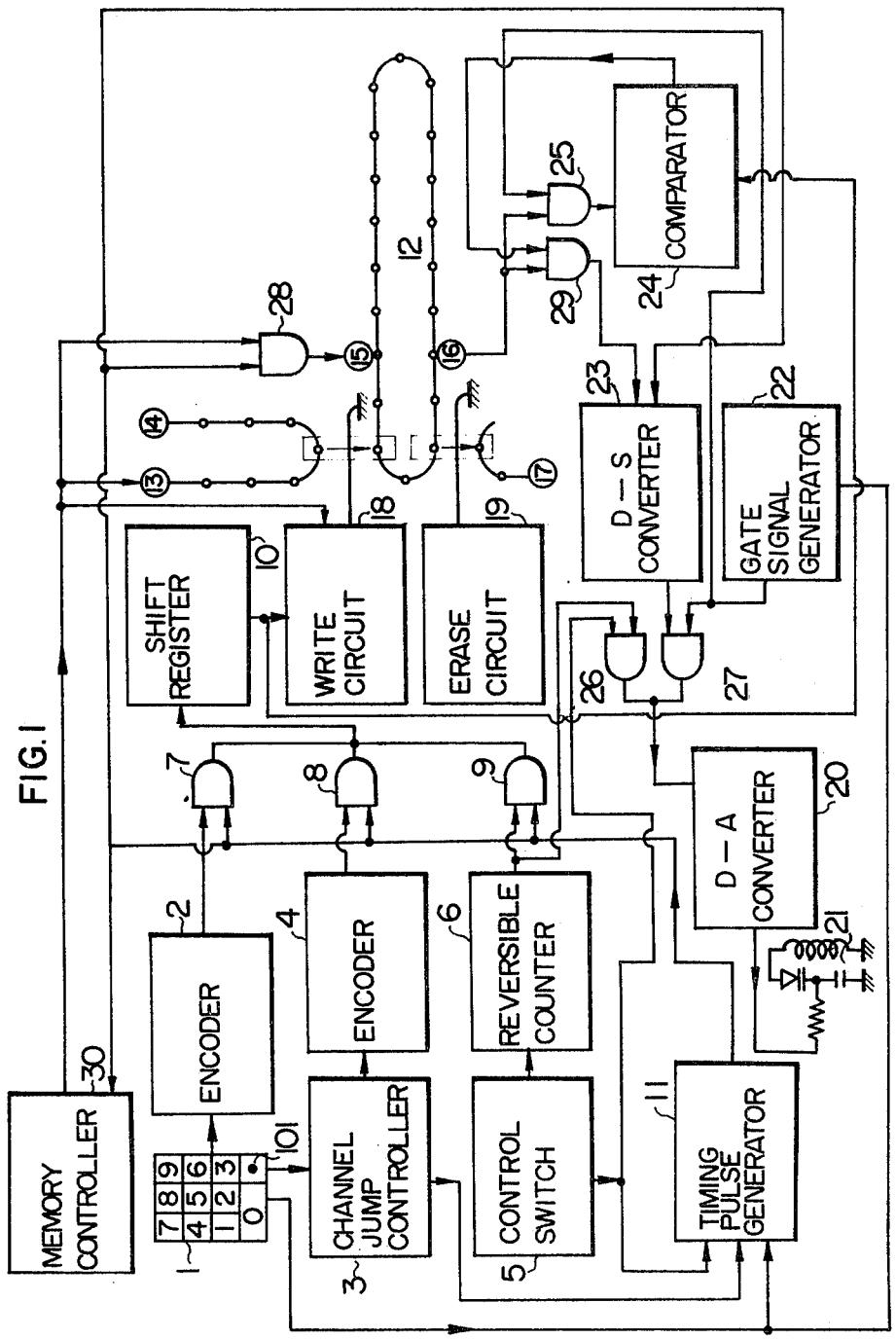

United States Patent [19]
Sakamoto

[11] 3,979,680
[45] Sept. 7, 1976

[54] CHANNEL SELECTOR

[75] Inventor: Yoichi Sakamoto, Takatsuki, Japan

[73] Assignee: Matsushita Electric Industrial Co., Ltd., Osaka, Japan

[22] Filed: Nov. 15, 1973

[21] Appl. No.: 416,118

[52] U.S. Cl. .............................. 325/464; 325/468; 334/15
[51] Int. Cl.² .......................................... H04B 1/26
[58] Field of Search ........... 325/464, 465, 452, 453, 325/459, 468; 334/14, 15; 340/173 SP, 174 SP, 174 TF, 174 GA

[56] References Cited
UNITED STATES PATENTS

| | | | |
|---|---|---|---|
| 3,290,659 | 12/1966 | Fuller et al. | 340/174 GA |
| 3,652,960 | 3/1972 | Sakamoto et al. | 334/15 |
| 3,810,022 | 5/1974 | Collins | 325/464 |

OTHER PUBLICATIONS
B351,665, Jan. 1975, Chang et al., 340/174 GA.

*Primary Examiner*—Benedict V. Safourek
*Attorney, Agent, or Firm*—Stevens, Davis, Miller & Mosher

[57] ABSTRACT

A channel selector comprising a tuning circuit including a variable reactance element as a tuning element and a non-volatile memory for permanently memorizing coded signals of channel selecting voltages to be applied to said variable reactance element, and being arranged in such a manner that the channel identification numbers and the coded signals for selecting these channels can be correspondingly memorized preliminarily in said non-volatile memory, and in channel selection the coded signal of the channel selecting voltage corresponding to a desired channel can be read out from said non-volatile memory, converted into a voltage and applied to said variable reactance element to achieve channel selection. A selected channel does not change by the cutting of the power source and the device is purely electronic. The device is especially effective for use in a television receiver.

10 Claims, 2 Drawing Figures

CHANNEL SELECTOR

This invention relates to a channel selector, of the type found in a television receiver, using a so-called electronic tuner including a voltage variable reactance element as a tuning device. In such a tuner a selected voltage is applied to the variable reactance element for selecting a desired channel.

In conventional channel selectors, especially those used in television receivers, tuning capacitors, solenoids, etc. are directly selected through a mechanical switch such as a rotary switch. Therefore, the channel selecting mechanism becomes complicated, large and expensive. Further, there is the disadvantage that poor contact in the switch may arise after long use. To eliminate these drawbacks, there has been proposed a device in which a variable reactance element is used as a tuning element and a multiplicity of variable resistors are provided for preliminarily setting tuning voltages for respective channels. The voltages are applied to this variable reactance, the variable resistors being switched electronically by the use of a key board and a binary circuit. In this case, the variable resistors are readily affected by changes in the environment, i.e. in the case of high temperature and/or high humidity poor contact and/or changes in resistance may arise to cause poor operation. Further, in such a system, once the power source is cut off, the channel selector changes at random. Thus, when the power source is connected again, the system cannot select the channel which was selected before the cut-off of the power source. If one desires to select the channel, one must again designate it.

Thus, an object of this invention is to provide a channel selector capable of always stably achieving channel selection action (i.e. regardless of the lapse of time, and changes in environment), and holding the channel selected before the power source was cut off even after the power source is connected again.

Another object of this invention is to provide a channel selector capable of extremely easily performing a channel jump selection.

A further object of this invention is to provide a channel selector using a non-volatile memory for memorizing coded voltages for selecting channels, etc. and which is capable of easily and accurately memorizing channel selecting voltages, etc. in this non-volatile memory.

According to an embodiment of this invention, there is provided a channel selector comprising a tuning circuit including a variable reactance element acting as a tuning element, a non-volatile memory for memorizing permanently coded signals of channel selecting voltages or currents to be applied to said variable reactance element, which are different for respective channels, and means for reading at least a coded signal of voltage or current for selecting a desired channel from said non-volatile memory, converting the read-out coded signal into a channel selecting voltage or current and applying it to said variable reactance element to control the tuned frequency. The non-volatile memory memorizes the channel numbers and the corresponding channel selecting voltages in coded signals and the channel selection can be achieved by designating the number of a desired channel.

According to the present channel selector, since the channel selecting voltages are coded and memorized in a non-volatile memory, the memorized content is neither erased nor disturbed but maintained even after cut-off of the power source. Therefore, when the power source is connected again after the lapse of time, a channel selected previously is continuously selected. Further, since the setting and memory of a channel selecting signal is done purely electronically, the device is free from unstable operation and poor contacts even when it is subjected to external vibrations and humidity. Thus, the device can always provide stable channel selection. Further, since the signals to be stored in the non-volatile memory are stored once in a volatile auxiliary register such as a shift register and then memorized in the non-volatile memory, even when a non-volatile memory having a long shift period circulating all the memory regions is used, writing in an incorrect region is prevented and accurate memorization can be easily accomplished regardless of the timing of channel the selection operation. Further, since a channel jump control signal for controlling whether the channel selection should be stopped at some channel or jump that channel is simultaneously memorized in the nonvolatile memory, only the preset channels to be selected (i.e. channels not to be jumped over) can be successively selected by simple operations.

Figure 2:
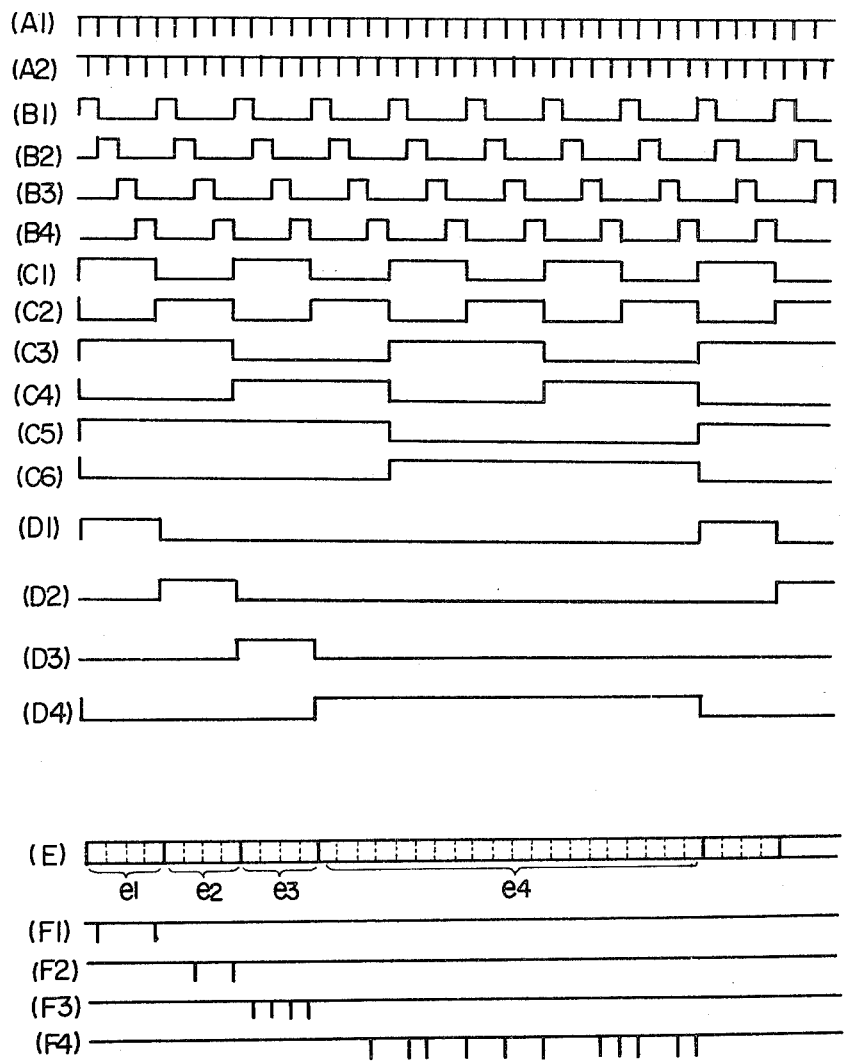

These and other objects, features and advantages of the present invention will become apparent from the following description taken in conjunction with the accompanying drawings, in which:

FIG. 1 is a block diagram showing a channel selection system according to the present invention; and FIG. 2 shows waveforms at various parts of the system of FIG. 1 for explaining the operation.

In FIG. 1, a control signal input stage comprises a key board 1 for designating channel selection, and encoder 2 converting a parallel pulse output signal of the key board 1 into a series pulse train signal, a channel jump control circuit 3 for generating a channel jump signal for controlling jump/non-jump of selected channels, an encoder 4 for converting the output signal of the jump control circuit 3 into a series pulse train signal, a switching circuit 5 for controlling the channel selecting voltage setting which controls a reversible counter 6 for generating a channel selecting voltage as a digitalized voltage signal, AND gate circuits 7, 8 and 9 respectively provided in the output circuits of the encoders 2 and 4 and the reversible counter 6, and a shift register 10 for temporarily memorizing the output pulse train signals of the encoders 2 and 4 and the reversible counter 6 in this order. A timing pulse generator circuit 11 receives the trigger signals generated from the key board 1, the jump controller circuit 3, and the switching circuit 5 (generated prior to any of the control signals), and generates timing pulse signals for controlling the actions of the encoders 2 and 4, the reversible counter 6, the AND gates 7, 8 and 9, the shift register 10, etc. Next, a channel selecting voltage memory stage will be described. Here, an example is given of a memory stage using magnetic bubble memory utilizing the magnetic bubble domain. The memory stage comprises a magnetic bubble memory 12, a magnetic bubble generator 13 for writing, 14 a magnetic bubble eraser, 15 a magnetic field generator for transferring magnetic bubbles, 16 a magnetic bubble sensor for reading the memory content of the magnetic bubble memory 12, 17 a magnetic bubble eraser for erasing the memory, 18 a magnetic bubble write circuit, and 19 a magnetic bubble erase circuit. Next, the stage for reading the channel selecting voltage stored in the magnetic bubble memory 12 and carrying out the channel selection will be described. The reading and channel selecting stage comprises a digital-analog (D-A) converter for converting the digitalized channel selecting voltage used in the reversible counter 6, the magnetic bubble memory 12, etc. into analog channel selecting voltage used practically in a tuner, an electronic tuner circuit 21 using a voltage varied capacitance diode as a tuning element, a gate signal generator 22 for channel selection which receives the trigger signal from the key board 1 and generates a gating signal for controlling the transfer of the memory content of the magnetic bubble memory 12 to the following stage in channel selection, a dynamic-static (D-S) converter 23 for converting the series pulse train signal of the digitalized channel selecting voltage read from the magnetic bubble memory 12 into a parallel pulse signal assembly, a comparator 24 for comparing the memory content of the shift register 10 and that of the magnetic bubble memory 12 read out through the magnetic bubble sensor 16, AND gates 25, 26, 27, 28 and 29 for controlling the transfer of respective signals, and a memory controlling circuit 30 for controlling the writing of the channel selection number signal from the key board 1, the jump control signal from the jump control circuit 3, and the digitalized channel selecting voltage from the reversible counter 6 which are temporarily stored in the shift register 10 into the magnetic bubble memory 12 and memorizing them permanently.

The operation of the channel selector device of the above structure will be described referring to the respective waveforms shown in FIG. 2.

First, the timing generator circuit 11 generates necessary timing pulse signals, for example, A1 to A2, B1 to B4, C1 to C6, and D1 to D4 shown in FIG. 2 which control the operation timing of the circuit of FIG. 1. The timing pulse signal A1 is the clock pulse which acts as the standard timing signal for the actions of all the pulse circuits such as the encoders 2 and 4, the reversible counter 6, the shift register 10, and the D-S converter 23. The timing pulse A2 is the standard pulse signal which is formed by delaying the clock pulse A1 by about one half period and acts as the basis for various signals. It is noted here that, in the present device, regarding the channel selection number signal (2 digits) and the jump instruction signal (1 digit) 4 bits constitute 1 digit. Further, 20 bits are used for digitalizing the channel selecting voltage. The timing pulses B1, B2, B3 and B4 are bit designating pulses which are respectively formed by frequency-dividing the clock pulse A1. Namely, the pulse signal B1 is generated at the first bit of every digit, B2 at the second bit, B3 at the third bit and B4 at the fourth bit. These bit designating pulse signals B1 to B4 are used for writing the output signal of the encoders 2 and 4 into the shift register by every one bit. The pulse signals D1 to D4 are input control circuit discriminating pulses which are respectively formed by frequency-dividing the clock pulse A1 and using a logic circuit. The input control circuits comprise the key board 1, the channel jump control circuit 3 and the reversible counter 6 (the switching circuit 5) which generate respective pulse train signals. The input control circuit discriminating pulses D1 to D4 are used for generating those pulse train signals in a certain order to input them in predetermined digits of the shift register 10, and for reading the memory pulse train signal of a particular digit from the magnetic bubble memory 12, etc. Here, the pulse signals D1 to D4 discriminate the portion of the digit 10 (decade digit) in the channel selection number signal (which is represented by a decimal two figure number) in the key board 1, the portion of the digit 1 (unit digit) in the channel selection number signal in the key board 1, the portion of the channel jump control signal, and the portion of the digitalized channel selecting voltage, respectively. Here, the pulse signals C1 to C6 intermediate signals obtained by frequency-dividing the clock pulse A1 for obtaining the respective discriminating pulse signals D1 to D4, which are in the relations of C2 = C1, C4 = C3 and C6 = C5. The respective discrimination pulse signals are formed as D1 = C1·C3·C5, D2 = C2·C3·C5, D3 = C1·C4·C5, and D4 = C2·C4·C5 + C6. In other words, these respective discrimination signals D1 to D4 determine the arrangement of the respective memory signals in the magnetic bubble memory 12. A model of such a memory arrangement in the magnetic bubble memory 12 is shown by E, in which e1 indicates the domain when the portion of the digit 10 of the channel selection number signal is memorized, e2 the domain of the digit 1 similarly, e3 the domain of the jump control signal, and e4 the domain of the digitalized channel selecting voltage.

Next, the case of selecting channel by the use of these timing pulses A1 to D4 will be described. First, the action of storing the channel selecting voltage in the magnetic bubble memory 12 will be described. It is assumed here that the 95th channel is to be selected and memorized. In this case, one operates first the key of "9" and then the key of "5" in the key board 1. Then, in a period of the discrimination pulse signal D1, a digitalized signal F1 of (1001) corresponding to 9 in the digit 10 of the channel selection number is generated in the encoder 2 and is written in the domain corresponding to the memory domain e1 of the shift register circuit 10 through the AND circuit 7 which is opened only by the discrimination pulse signals D1 and D2. Successively, a signal F2 of (0101) corresponding to 5 of the digit 1 is written in the domain corresponding to the memory domain e2 in the shift register circuit 10. Next, the input of channel jump or nonjump (stop) is made from the channel jump control circuit 3 for distinguishing whether this 95th channel needs to be read out later or not, i.e. whether the 95th channel is a channel through which broadcasting is done or not, and memorizing whether the 95th channel may be jumped or not when the channel selection is done later. This channel jump control signal is transferred from the encoder 4 to the shift register 10 through the AND gate 8 which opens only in the period of the discrimination pulse signal D3 and is written in the domain corresponding to the memory domain e in the shift register circuit 10, as is shown by F3. Here, a pulse train signal of (1111) is used as the channel non-jump (stop) control signal and a null pulse train signal (0000) is used as the jump (pass) control signal. Next, for selecting the 95th channel, the channel selecting voltage to be applied to the variable capacitance diode in the tuner circuit 21 is preset. This presetting of the channel selecting voltage is done by controlling an increase or decrease for the content of the reversible counter 6 through the switching circuit 5. This reversible counter 6 is formed of a binary counter of 20 bits and thus can generate signals of $2^{20}$ steps. For example when one step is set equal to $10^{-3}$ V and the voltage to be applied to the tuner circuit 21 for selecting the 95th channel is determined to be 185.659 V, this channel selecting voltage is digitalized as shown by F4, generated and supplied to the shift register circuit 10 through the AND gate circuit 9 which opens only in the period of the discrimination pulse signal D4, and written in the domain corresponding to the memory domain e4 in the shift register 10. At the same time, this digitalized channel selecting voltage signal F4 is transmitted to the D-A converter circuit 20 through the AND gate 26, converted into an analog voltage of 189.659 V and supplied to the tuner circuit 21. In this way, the digitalized signals for selecting the 95th channel are all written in the shift register 10 once. This shift register 10, however consists of flip-flops, etc. Thus, once the power source is disconnected, the memory content is maintained no longer. If such memory contents are permanently stored in a nonvolatile memory, e.g. a magnetic bubble memory 12, which holds the memory regardless of the disconnection and the reconnection of the power source, channel selection thereafter can be done only by reading out the memory content and the setting of the channel selecting voltage at each channel selection need not be done. Namely, when the output signal (the memory content signal) of this shift register 10 is to be applied to the write circuit 18 and memorized in the magnetic bubble memory 12, the memory control circuit 30 is operated to drive the write circuit 18, the magnetic bubble generator 13 and the magnetic field generator for transferring magnetic bubbles 15 and to memorize the signal domain e1 of the digit 10 of the channel number, the signal domain e2 of the digit 1 of the channel number, the domain e3 of the channel jump control signal, and the domain e4 of the channel selecting voltage, in this order. In this manner, the channel number signal, the channel jump control signal, and the channel selecting voltage signal can be successively memorized permanently in the magnetic bubble memory 12 for every channel.

Next, the operation of selecting a channel utilizing the signals memorized in the magnetic bubble memory 12 in the above manner will be described. First, when one wishes to select a particular channel, for example the 95th channel, one should operate the key 9 and then 5 on the key board 1. Thus, the channel number signal for the 95th channel is written in the shift register 10 by actions similar to those described before. This written channel number signal is also transmitted to one input terminal of the comparator circuit 24. At the same time, upon the trigger signal from the key board 1, the channel selecting gate signal generator 22 generates a gate signal to open the AND gate circuit 25. Thereby, the channel number signal memorized in the magnetic bubble memory 12 and read out by the magnetic bubble sensor 16 is applied to the other input terminal of the comparator 24 and compared with the channel number signal from the shift register therein. When the two channel number signals do not coincide, no output is generated from the comparator circuit 24 and the next channel number signal in the magnetic bubble memory 12 is successively read out. A similar process continues until coincidence is achieved. Thus, when the memory domain for the 95th channel in the magnetic bubble memory is read out, the comparator circuit 24 detects the coincidence of the two channel number signals, and generates the coincidence signal to open AND gate 29 and transmit the digitalized pulse train signal of the channel selecting voltage memorized in the memory domain e4 of the 95th channel to the D-S converter circuit 23. This pulse train signal of the channel selecting voltage read out from the magnetic bubble memory 12 is transmitted to the D-A converter circuit 20, converted into the channel selecting voltage of an analog quality therein, and supplied to the tuner circuit 21 to perform the tuning, i.e. channel selection, of the 95th channel in this example. The channel selection for other channels can be done in exactly the same manner.

Next, the case will be described in which no particular channel is designated in the key board 1, but the channel selection is successively repeated on by one. Here, those channels which have no broadcasting are jumped over. In this case, the successive selection key (101) is operated on the key board 1, then a signal for adding 1 to the present channel number is generated at a certain period. Thus, the content of the memory domains e1 and e2 for the channel number signal in the shift register 10 increases one by one at each of the certain period. At the same time, by the operation of this successive selection key (101), the non-jump control signal (1111) is written in the shift register 10. Thus, the channel number signals increasing successively one by one and the channel non-jump control signal are transmitted to the comparator circuit 24. Thus, if the 95th channel has been selected and now the successive selection key (101) is operated, the channel number signal for the 96th channel and the channel non-jump control signal are transmitted from the shift register 10 to the comparator 24. Even when the memory content read out from the magnetic bubble memory 12 through the magnetic bubble sensor 16 is of the 96th channel, if the non-jump control signal is not memorized, the comparator 24 does not detect the coincidence and the 96th channel is never selected. After the lapse of a certain period the channel number signal in the shift register increases to the 97th channel, the 98th channel —. If the channel non-jump control signal is not memorized in the magnetic bubble memory, the corresponding channel is always jumped over. The comparator 24 generates a correspondence signal and opens the AND gate 29 to read out the channel selecting voltage of the channel only when the channel selection comes to a channel in which a non-jump transfer control signal is memorized. A similar process continues thereafter. In this way, the channel selection automatically procedes from the present channel to the next channel in which a non-jump transfer control signal is memorized.

In the embodiment described hereinabove, a magnetic bubble memory was used as a permanent memory means, but is apparent that any so-called non-volatile memory which holds the memory content regardless of the disconnection and reconnection of the power source, such as a magnetic disk or a magnetic tape, can be used in place of the magnetic bubble memory. Thus the term "non-volatile memory" refers to ordinary ROM (Read Only Memory), core memories, etc., and also refers to any memory of the mentioned type in which the memory content can be rewritten. Additionally, the preceding description, it should be understood that the concept of the term "permanently memorizing or storing " covers not only the use of completely permanently memories such as ordinary read-only memories whose memory contents can not be rewritten or changed, but also the use of other type of permanent memories whose memory contents can be rewritten or changed when the user needs to do so.

Further, although a shift register was used for temporarily memorizing signals in the above embodiment, it is apparent that any volatile auxiliary register which can easily memorize and erase signals can be used similarly to achieve similar actions.

I claim:

1. In a channel selector having a tuning circuit employing a variable reactance element, memorization means comprising:

first means for producing first coded signals representing channel numbers corresponding to said channels respectively, second means for producing second coded signals representing voltages respectively corresponding to said first coded signals, said second coded signals being coupled to the reactance element of said tuning circuit for tuning said circuit to a selected channel, and means for including a non-volatile memory for permanently storing therein both first and second coded signals; and channel selection means comprising:

read-out means coupled to said non-volatile memory for reading out from said memory a desired second coded signal in response to the selected first coded signal, and means for converting the read-out second coded signal into said corresponding voltages for application thereof to said reactance element, said channel selector memorizing electrical signals corresponding to tuning channels in said non-volatile memory, channel selection thereafter being effected by tuning said tuning circuit to a desired one of said channels by reading out said memorized signals.

2. A channel selector according to claim 1, wherein said non-volatile memory comprises a closed loop consisting of serial memory bit domains for sequentially storing therein said first and second coded signals, said selector further comprising means for circulating the stored signals bit-by-bit with respect to said read-out means.

3. A channel selector according to claim 1, which further comprises a volatile auxiliary memory for temporarily storing therein said signals, said auxiliary memory permitting said signals to be correctly stored at locations within said non-volatile memory.

4. A channel selector according to claim 3, wherein said non-volatile memory comprises a magnetic bubble memory.

5. A channel selector according to claim 1, wherein said non-volatile memory comprises a magnetic bubble memory.

6. In a channel selector having a tuning circuit employing a variable reactance element, memorization means comprising:

first means for producing selected channel instruction signals respectively corresponding to numbers designating desired channels;

second means for producing coded signals representing voltages respectively corresponding to said channels, said coded signals being coupled to the reactance element of said tuning circuit for tuning said circuit to a selected channel; and means including a non-volatile memory for permanently storing therein said coded signals together with the corresponding instruction signals; and channel selection means comprising:

read-out means coupled to said non-volatile memory for reading out the stored signals therefrom;

means, including conversion means for converting the read-out coded signals in the corresponding voltages, for coupling said second read-out means to said reactance element; and means responsive to the read-out selecting channel instruction signals for effecting conversion of the read-out coded signals only with respect to the numbers designating said desired channels and preventing said conversion with respect to the numbers designated the remainder of said channels.

7. A channel selector according to claim 6, wherein said non-volatile memory defines a closed loop of serial memory bit domains for sequentially storing therein said instruction signals and coded signals per channel; said channel selector further comprising means for circulating the stored signals in said loop bit-by-bit with respect to said read-out means, said first means including means for producing said instruction signals in the form of bivalent signals which assume a first level to effect conversion of desired channels and assume a second level to prevent said conversion; and also comprising means for effecting circulation of stored signals by one channel of bits in response to the instruction signal of said second level.

8. A channel selector according to claim 7, wherein said non-volatile memory comprises a magnetic bubble memory.

9. A channel selector according to claim 7, which further comprises a volatile auxiliary memory for temporarily storing therein said signals, said auxiliary memory permitting said signals to be currently stored at locations within said non-volatile memory.

10. A channel selector according to claim 9, wherein said non-volatile memory comprises a magnetic bubble memory.

* * * * *